(12) United States Patent
Lee et al.

(10) Patent No.: US 9,224,896 B2
(45) Date of Patent: Dec. 29, 2015

(54) PHOTOELECTRIC CONVERSION MATERIAL

(71) Applicant: National Tsing Hua University, Hsinchu (TW)

(72) Inventors: Chi-Young Lee, Hsinchu (TW); Hsin-Tien Chiu, Hsinchu (TW); Po-Chin Chen, Hsinchu (TW); Min-Chiao Tsai, Hsinchu (TW)

(73) Assignee: National Tsing Hua University, Hsin-Chu (TW)

( * ) Notice: Subject to any disclaimer, the term of this patent is extended or adjusted under 35 U.S.C. 154(b) by 188 days.

(21) Appl. No.: 13/788,868

(22) Filed: Mar. 7, 2013

(65) Prior Publication Data

US 2014/0138689 A1  May 22, 2014

(30) Foreign Application Priority Data

Nov. 22, 2012 (TW) .............................. 101143659 A

(51) Int. Cl.
*H01L 31/0256* (2006.01)
*H01L 31/0352* (2006.01)
*C04B 35/46* (2006.01)
*C04B 14/30* (2006.01)
*C04B 41/50* (2006.01)
*C04B 35/49* (2006.01)
*B01J 35/00* (2006.01)
*C04B 111/00* (2006.01)

(52) U.S. Cl.
CPC ....... *H01L 31/035281* (2013.01); *B01J 35/004* (2013.01); *C04B 14/305* (2013.01); *C04B 35/46* (2013.01); *C04B 35/49* (2013.01); *C04B 41/5041* (2013.01); *B01J 35/002* (2013.01); *C04B 2111/00827* (2013.01); *C04B 2235/3232* (2013.01); *C04B 2235/787* (2013.01); *H01L 2924/1017* (2013.01); *Y02E 10/50* (2013.01)

(58) Field of Classification Search
CPC .............. C04B 14/305; C04B 41/5041; C04B 2111/00827; C04B 35/49; C04B 35/46; C04B 2235/3232; C04B 2235/787; H01L 31/035281; H01L 2924/1017
USPC .......................................................... 257/55
See application file for complete search history.

(56) References Cited

U.S. PATENT DOCUMENTS

2010/0307593 A1* 12/2010 Thimsen et al. .............. 136/263

* cited by examiner

*Primary Examiner* — Howard Weiss
*Assistant Examiner* — Tifney Skyles
(74) *Attorney, Agent, or Firm* — WPAT, P.C.; Anthony King

(57) ABSTRACT

A photoelectric conversion material is disclosed in the present invention and comprises at least a cone material. The cone material is composed of an isomer and comprises a plurality of grains. The sizes of the grains are arranged from smaller ones to larger ones along a direction. In the meantime, a method for fabricating the above photoelectric conversion material is also disclosed here. The method comprises the following steps. First, a precursor is provided. The precursor comprises at least a cone material and the cone material is a multilayer structured material, such as sodium titanate and potassium titanate, formed by stacking first materials and second materials. And then, the precursor is annealed to let the second materials leave from the cone material, and the cone material becomes the above photoelectric conversion material with a plurality of grains.

3 Claims, 12 Drawing Sheets

PHOTOELECTRIC CONVERSION MATERIAL

CROSS-REFERENCE TO RELATED APPLICATIONS

This Non-provisional application claims priority under 35 U.S.C. §119(a) on Patent Application No(s). 101143659 filed in Taiwan, Republic of China, Nov. 22, 2012, the entire contents of which are hereby incorporated by reference.

FIELD OF THE INVENTION

This invention relates to a photoelectric conversion material, especially relates to a photoelectric conversion material composed of an isomer with a plurality of grains and a method for fabricating the photoelectric conversion material. It is noted that the grains have different sizes and can be arranged along a direction to decrease a recombination rate of $e^-/h^+$ pairs (electron-hole pairs).

BACKGROUND OF THE INVENTION

A hybridized orbital of a semiconductor material has a conductive band, and its electrons of the valence band will be promoted across the band gap to the conductive band by absorbing an appropriate energy. At that time, the abovementioned material will become conductive.

Photocatalysis reaction is performed to create electron-hole pairs by radiating a semiconductor material, and the electron-hole pairs will generate radicals (e.g. hydroxyl radicals: .OH) able to undergo secondary reactions, such as pollutants removal, deodorization and disinfection. However, the band gap of the semiconductor materials, which can be used as an environmental photocatalyst, must fit in with the energy range of the radiation source so that the electrons can be promoted across the band gap to the conductive band via the abovementioned radiation and further generate redox ability.

Titanium dioxide occurs in nature as well-known minerals rutile, anatase and brookite and is extensively applied in photocatalysis reaction due to its excellent structure and properties. The brookite-type phase is unusable due to its instability. Furthermore, although the recombination rate of $e^-/h^+$ pairs of the rutile-type phase is faster, but the present method for fabricating the rutile-type phase is always performed by a calcination process. Therefore, the rutile-type phase has poor photocatalysis capability, or has no photocatalysis capability.

SUMMARY OF THE INVENTION

According to the abovementioned disadvantages of the prior art, the present invention tries to decrease the recombination rate of $e^-/h^+$ pairs and further improves the photoelectric conversion efficiency. When the material is radiated by a light source, electrons of its structure will be promoted across the band gap to the conduction band. And then, its surface will form electron holes due to the abovementioned loss of the electrons and contacts with air to form a plurality of radicals. The radicals will trap electrons and let organic compounds transfer to smaller molecules, such as carbon dioxide and water, to achieve a purpose of pollutants removal and deodorization. The photoelectric conversion material provided in the present invention has a better redox ability than that of the prior art.

According to the abovementioned, the photoelectric conversion material provided in the present invention comprises at least a cone material. The cone material is composed of an isomer with a plurality of grains, and the sizes of the grains are arranged from smaller ones to larger ones along a direction.

Preferably, the isomer is titanium oxide and the titanium oxide occurs as a mineral anatase.

Preferably, the photoelectric conversion material is an assembly of a plurality of the cone materials, and the assembly has a chrysanthemum-like appearance. Preferably, the direction the grains arranged along is extended from the exterior to the core of the assembly.

The present invention further provides a method for fabricating the abovementioned photoelectric conversion material and at least comprises the following steps. First, a precursor is provided. The precursor comprises at least a cone material, and the cone material is a multilayer structured material formed by stacking first materials and second materials. The precursor is then annealed to let the cone material become the photoelectric conversion material with a plurality of grains and composed of an isomer. The sizes of the grains are arranged from smaller ones to larger ones along a direction.

Preferably, the step of providing the precursor further comprises the following steps. First, the first materials are added into the second materials to obtain a mixing solution. And then, the mixing solution is transferred into a sealed vessel and heated slowly to a predetermined temperature. After a reaction time, an intermediate is obtained, and then pumped down to obtain the precursor.

Preferably, the predetermined temperature has a value from 150 degrees centigrade to 200 degrees centigrade, and the reaction time has a value from 5 hours to 48 hours. After the step of obtaining the intermediate, the method provided in the present invention further comprise a step of standing the intermediate for an appropriate time. Preferably, the appropriate time has a value from 8 hours to 24 hours. It is noted that the appropriate time is relative to the predetermined temperature.

Preferably, the precursor is an assembly of a plurality of the cone materials, and the assembly has a chrysanthemum-like appearance.

Preferably, an annealing temperature applied in the step of annealing the precursor has a value from 500 degrees centigrade to 800 degrees centigrade.

Preferably, the first material is a titanate compound and the second material is an organic compound composed of alkyl carboxylic acids. In an preferred embodiment, the abovementioned organic compound composed of alkyl carboxylic acids is acetic acid or an organic compound with an acetic group.

The features and advantages of the present invention will be understood and illustrated in the following specification and FIGS. 1~10.

DETAILED DESCRIPTION OF THE INVENTION

Figure 1:
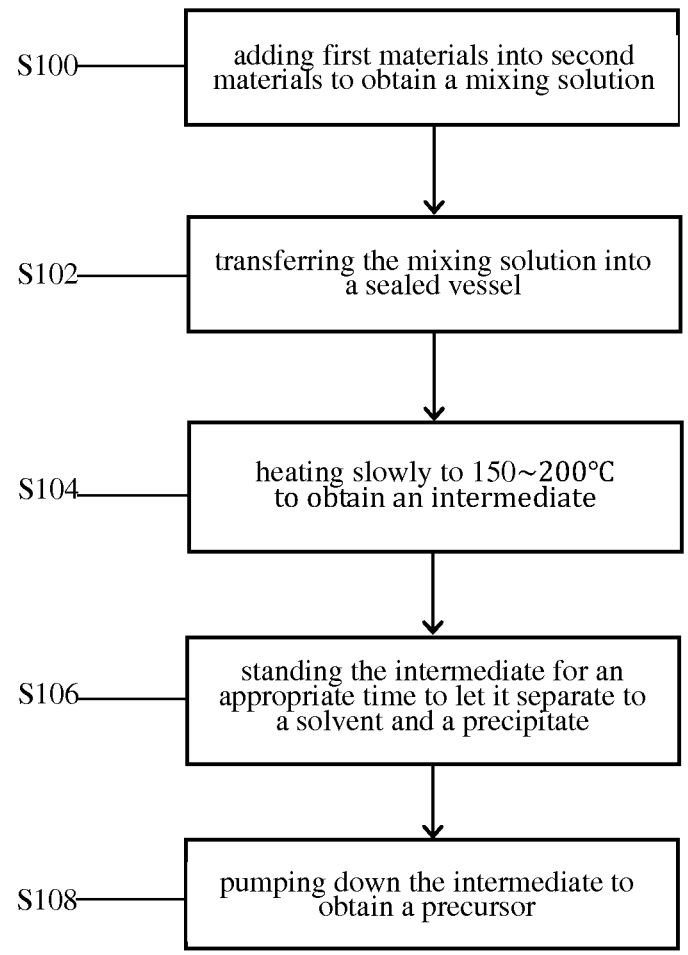
FIG. 1 is flow chart showing a method for fabricating a precursor according to a preferred embodiment of the present invention.

Before illustrating the method of fabricating the photoelectric conversion material provided in the present invention, FIG. 1, which is flow chart showing a method for fabricating a precursor according to a preferred embodiment of the present invention, is referred at first. As shown in step S100, first materials are added into second materials to obtain a mixing solution. In a preferred embodiment, the first material are titanate compounds and will be titanium isopropoxide preferably. The second materials are organic compounds composed of alkyl carboxylic acids. Preferably, the organic compound composed of alkyl carboxylic acids is acetic acid or an organic compound with an acetic group. Furthermore, the first material is a solution of 0.3 mL TTIP (1 mmol) and the second material is a solution of 10 mL acetic acid. However, the present invention will not be limited thereto. And then, the abovementioned mixing solution is transferred into a sealed vessel as shown in step S102.

In step S104, the mixing solution is slowly heated to a predetermined temperature. Preferably, the predetermined temperature has a value from 150 degrees centigrade to 200 degrees centigrade. It is noted that the predetermined temperature and the following steps will influence the structure of the precursor, and the detail will be illustrated later. Preferably, the step S104 is performed at the ramping rate of 5 degrees centigrade per minute. After a reaction time, an intermediate is obtained. Preferably, the reaction time has a value between 5 hours and 48 hours; however, the present invention is not limited thereto.

In an embodiment of the present invention, step S108 is then performed after step S104 when the predetermined temperature is 150 degrees centigrade. That is, the intermediate will be stood for a while according to a natural precipitation method, and 24 hours are preferred. And then, the solvent and the precipitate are separated. After removing the solvent, step S100 of pumping down the precipitate for 5 hours is performed to obtain the precursor.

Figure 2A:
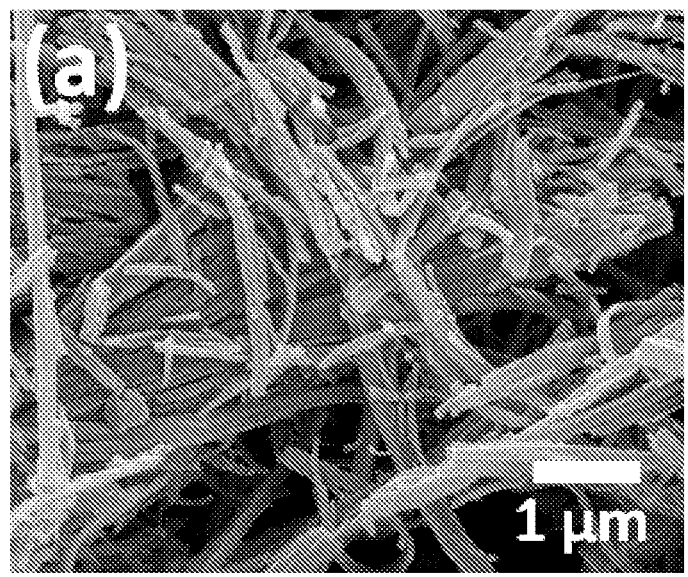
FIG. 2A is diagram showing a SEM image of a fibrillar precursor according to a preferred embodiment of the present invention.
Figure 2B:
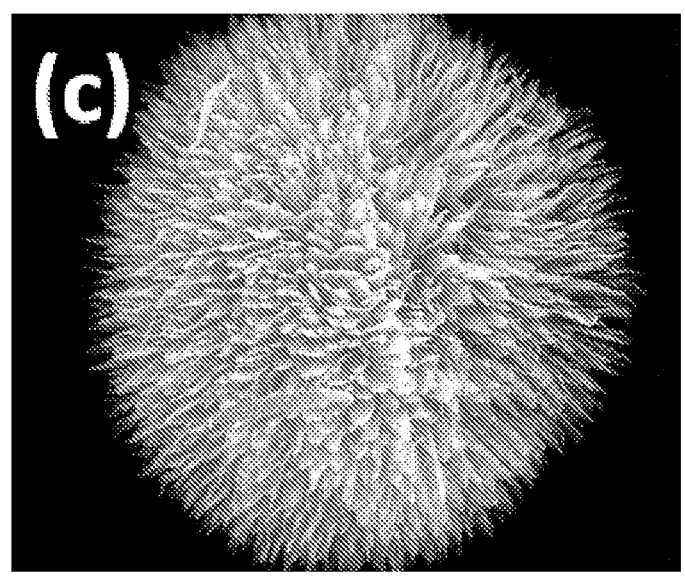
FIG. 2B is diagram showing a SEM image of a precursor composed of and showed by an assembly of a plurality of cone materials according to a preferred embodiment of the present invention.
Figure 2C:
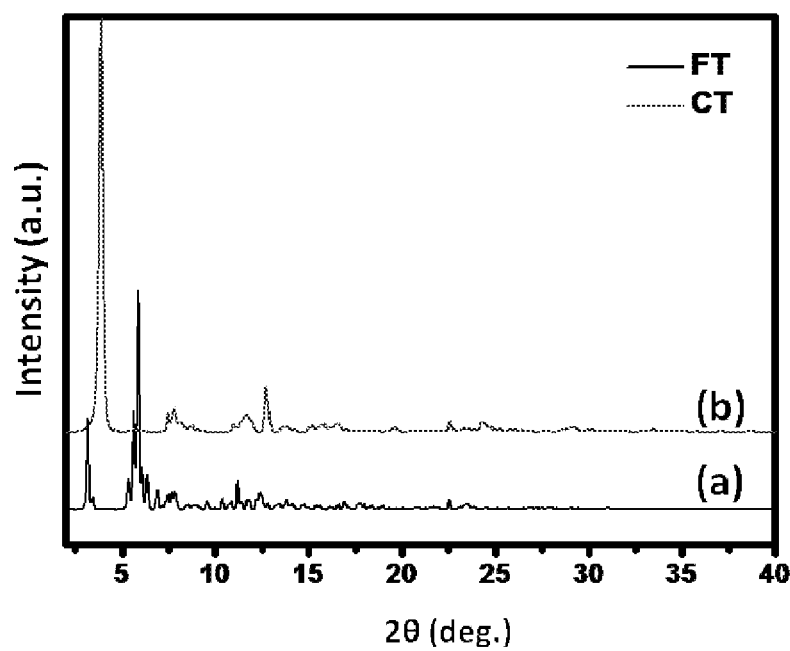
FIG. 2C is diagram showing X-ray diffraction patterns of the above two precursors in FIG. 2A and FIG. 2B.
Figure 3:
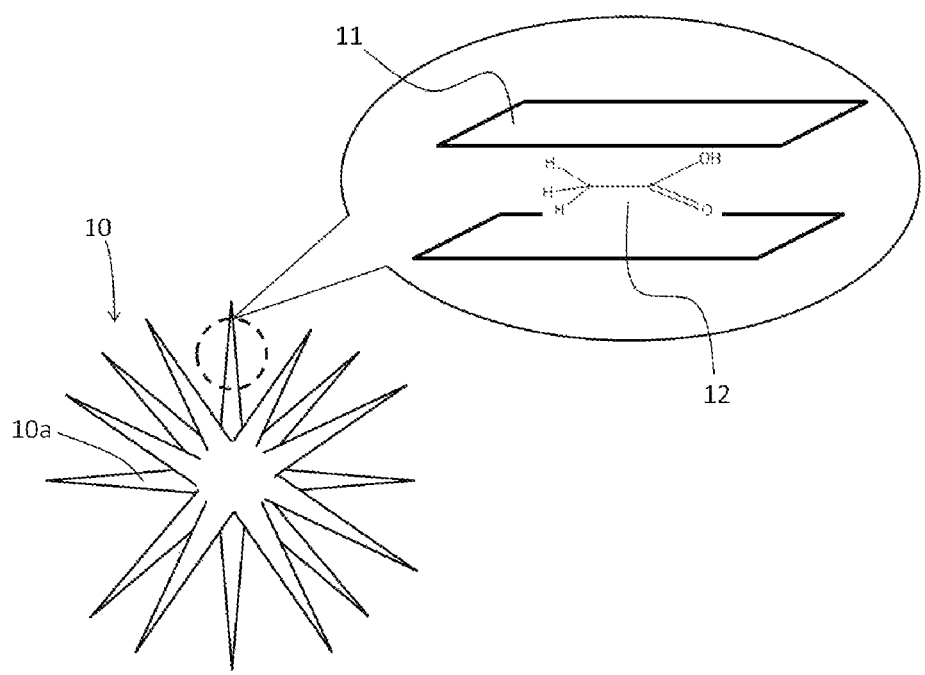
FIG. 3 is diagram showing the structure of the precursor composed of the assembly of a plurality of the cone materials.

Please refer to FIG. 2A to FIG. 2C and FIG. 3, FIG. 2A is diagram showing a SEM image of a fibrillar precursor (hereafter "FT") according to a preferred embodiment of the present invention, FIG. 2B is diagram showing a SEM image of a precursor composed of and showed by an assembly of a plurality of cone materials (hereafter "CT") according to a preferred embodiment of the present invention, FIG. 2C is diagram showing X-ray diffraction patterns of the above two precursors (FT and CT) in FIG. 2A and FIG. 2B, and FIG. 3 is diagram showing the structure of CT. It is needed to be described that the appearance of the precursor will affect the size distribution of the grains within the photoelectric conversion material, and further, the size distribution of the grains will affect the photocatalytic efficiency of the photoelectric conversion material. The details will be illustrated later.

Comparing to FIG. 2A, FIG. 2B shows an assembly of a plurality of the cone materials, and the assembly has a chrysanthemum-like appearance. However, the assembly can be described as having the abovementioned chrysanthemum-like appearance or a spherical-like appearance, the present invention is not limited thereto. Furthermore, the pattern (a) of FIG. 2C shows X-ray diffraction result of FT, and the pattern (b) of FIG. 2C shows X-ray diffraction result of CT. According to the comparison of the signals between the patterns (a) and (b), it is clearly that two different precursors are fabricated via the abovementioned steps S100~S108.

Although the crystal structure of the above precursors cannot be exactly solved, a multilayer structured material is obtained as shown in FIG. 3 after the abovementioned steps and proved through a plurality of analysis. That is, the precursor comprises at least a cone material 10a or an assembly 10 composed of a plurality of the cone materials. Furthermore, the cone material 10a is a multilayer structured material, such as sodium titanate and potassium titanate, and formed by stacking first materials 11 and second materials 12.

Figure 4:
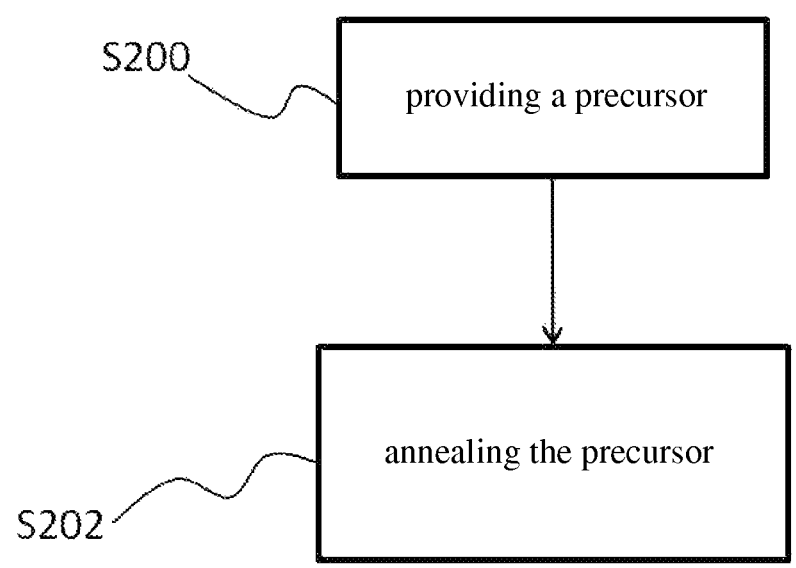
FIG. 4 is flow chart showing a method for fabricating the photoelectric conversion material according to a preferred embodiment of the present invention.

Please refer to FIG. 4, FIG. 4 is a flow chart showing a method for fabricating the photoelectric conversion material according to a preferred embodiment of the present invention. First, step S200 of providing the precursor is described in the abovementioned steps S100~S108. The precursor is then annealed as shown in step S202 to let the cone material become the photoelectric conversion material. The photoelectric conversion material is only composed of an isomer and comprises a plurality of grains. Preferably, the temperature applied in the step S202 has a value from 500 degrees centigrade to 800 degrees centigrade. The most important is that the sizes of the grains are arranged from smaller ones to larger ones along a direction.

Figure 5A:
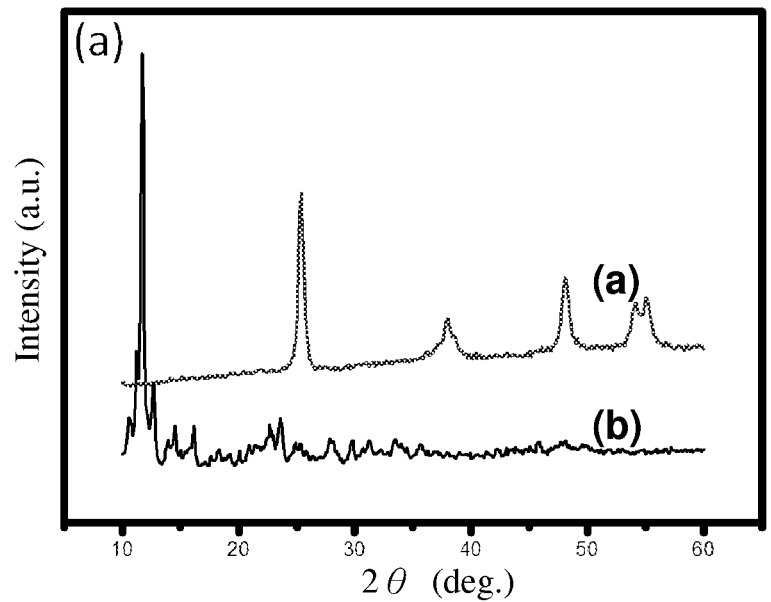
FIG. 5A is diagram showing X-ray diffraction patterns of the fibrillar precursor before and after the annealing step.
Figure 5B:
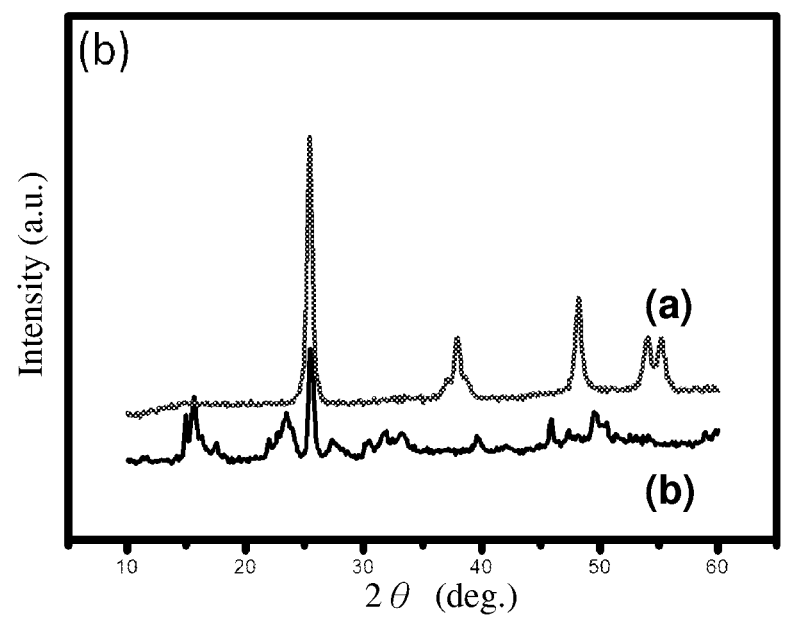
FIG. 5B is diagram showing X-ray diffraction patterns of the precursor composed of and showed by an assembly of a plurality of cone materials before and after the annealing step.

Please refer to FIG. 5A to FIG. 5B, FIG. 5A is diagram showing X-ray diffraction patterns of FT before and after the annealing step, and FIG. 5B is diagram showing X-ray diffraction patterns of CT before and after the annealing step. As shown in the patterns (a) of FIG. 5A and FIG. 5B, they both show the X-ray diffraction patterns of the precursors after annealing. On the contrary, the patterns (b) of FIG. 5A and FIG. 5B both show the X-ray diffraction patterns of the precursors before annealing. As shown in the figures, the second materials clipped between the first materials will depart due to the high temperature of the annealing process no matter which kind the precursor is. And then, the first materials, such as titanate compounds, become to a titanium oxide and the titanium oxide occurs as a mineral anatase. That is, the cone materials will become the photoelectric conversion material, which is only composed of an isomer and comprises a plurality of grains.

Figure 6A:
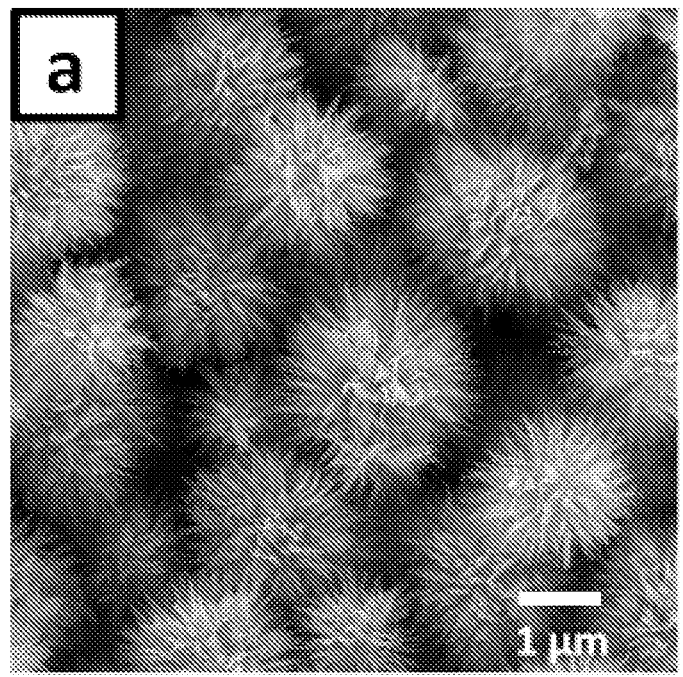
FIG. 6A to FIG. 6E are diagrams showing SEM images of the photoelectric conversion material according to a preferred embodiment of the present invention.
Figure 6B:
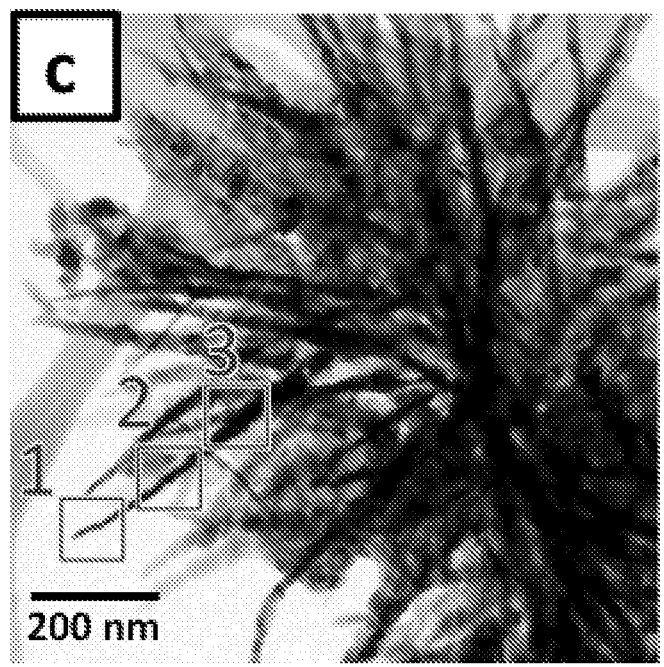
Figure 6C:
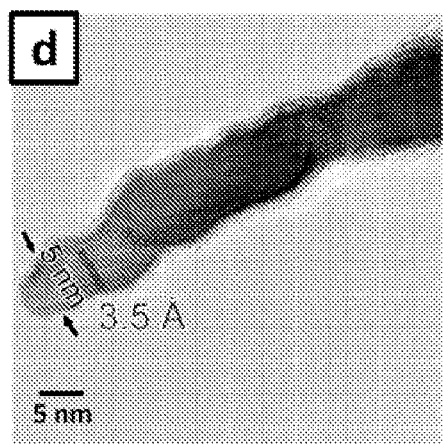
Figure 6D:
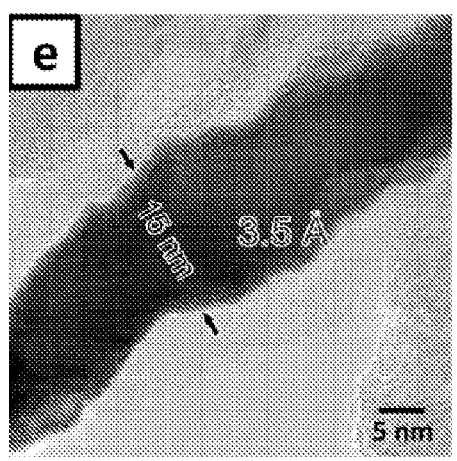
Figure 6E:
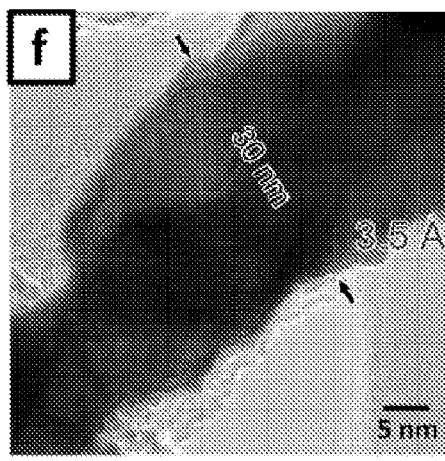

As to the arrangement of the grains, please refer to FIGS. 6A to 6E. FIG. 6A to FIG. 6E are diagrams showing SEM images of the photoelectric conversion material according to a preferred embodiment of the present invention. As shown in FIG. 6A, it shows the SEM image of the annealed CT and is partial enlarged as shown in FIG. 6B. And then, three different positions distributed from the exterior to the core of the assembly (CT) are marked and enlarged to show in FIGS. 6C to 6D, separately. It is clearly that the size of the grain, which positions at the exterior of the assembly, is 5 nm as shown in FIG. 6C, and the size of the grain, which positions near the core of the assembly, is 30 nm as shown in FIG. 6E. And further, the size of the grain, which positions between the abovementioned two, is 15 nm as shown in FIG. 6D. Thus, the cone material comprises a plurality of grains and those grains are arranged from smaller ones to larger ones along a direction. That is to say, when the grains are arranged from left to right, the size of the right grains must be larger than the left ones. On the other hand, the grains are arranged from the smaller ones to the larger ones and from the exterior to the core of the assembly when the photoelectric conversion material comprises the assembly composed of a plurality of the cone materials.

To sum up, the photoelectric conversion material fabricated by the method as mentioned before comprises at least a cone material. Preferably, the photoelectric conversion material comprises an assembly composed of a plurality of the cone materials, and the assembly has a chrysanthemum-like appearance. It is a emphasized that the photoelectric conversional material provided in the present invention is only composed of an isomer and comprises a plurality of grains. The sizes of grains are arranged from smaller ones to larger ones along a direction. Preferably, the isomer is titanium oxide, and the titanium oxide occurs as a mineral anatase.

Figure 7A:
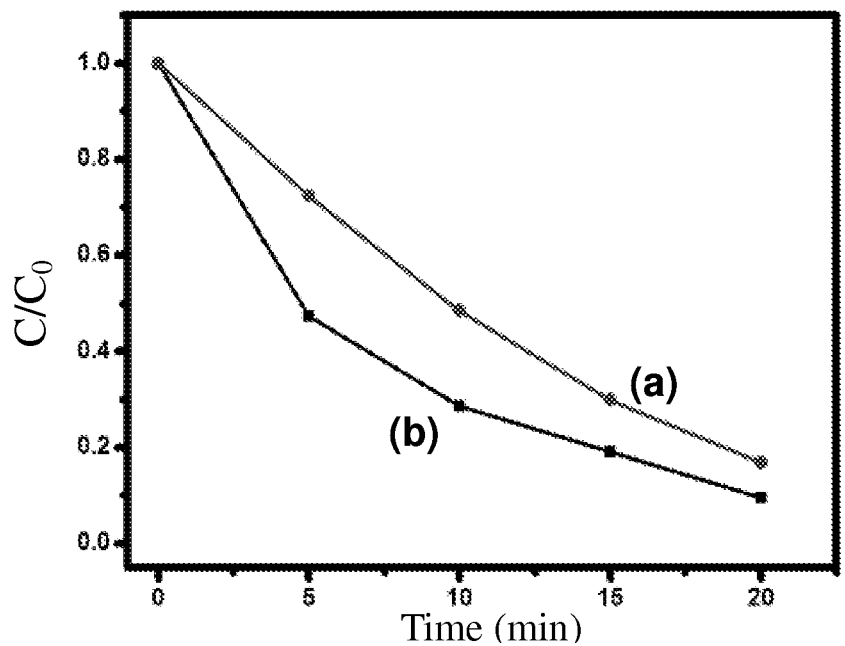
FIG. 7A to FIG. 7B are diagrams showing the degradation results of a prior material and the photoelectric conversion material according to a preferred embodiment of the present invention.
Figure 7B:
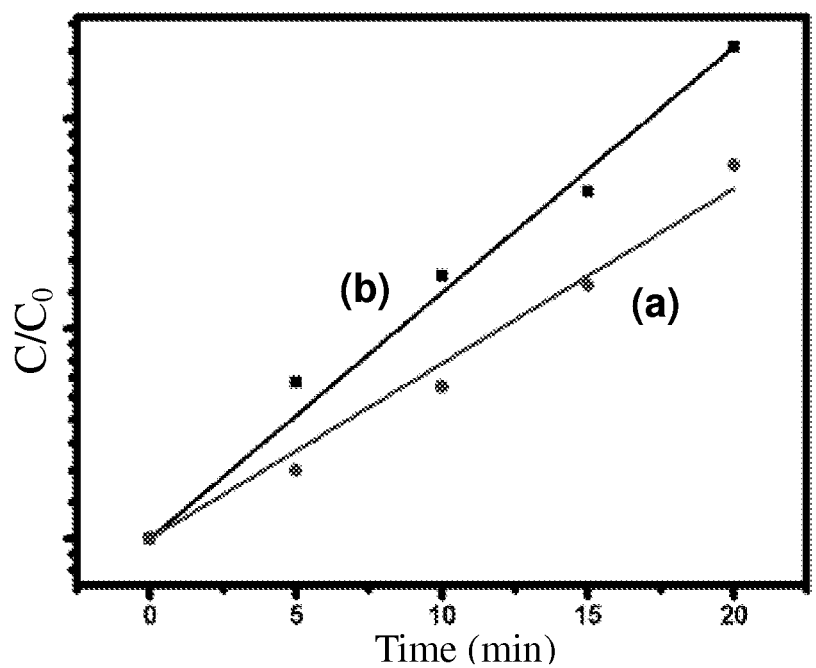

In order to prove the photocatalytic ability of the photoelectric conversion material provided in the present invention, a prior material P25 and the present photoelectric conversion material are used to degrade methylene blue separately. Please refer to FIGS. 7A to 7B, FIG. 7A shows the relationship between the concentration of methylene blue and the radiation time, FIG. 7B is a plot of In ($C_0/C$) versus radiation time. And then, a reaction rate constant can be obtained from the slope of FIG. 7B wherein $C_0$ is initial concentration, C is the concentration after radiation, the pattern (a) represents the prior material P25, and the pattern (b) represents the photoelectric conversion material provided in the present invention.

As shown in FIG. 7B, the slope of the pattern (b) is 0.11713 and the slope of the pattern (a) is 0.08339. That is, the reaction rate constant of the photoelectric conversion material provided in the present invention is 1.4 times than that of the prior material P25. It is emphasized that the photocatalytic efficiency of the photoelectric conversion material of the present invention is obviously better than the prior one, such as P25.

As mentioned before, the prior material, such as P25, is composed of titanium dioxide with anatase-type phase and rutile-type phase. Because the above two phases comprise different band gaps, a heterojunction is formed between them to let electrons move toward one phase with the lower energy state and electron holes move toward another phase. It means P25 has good photocatalytic ability and is extensively applied. However, the photoelectric conversion material is only composed of titanium oxide with anatase-type phase so that there is no heterojunction formed. As mentioned before, the grains are arranged from the smaller ones to the larger ones and from the exterior to the core of the material so that the smaller grains will have higher energy state. Therefore, the electrons excited by a light source will move from the tip of the chrysanthemum to the core of the chrysanthemum. It will decrease the recombination rate of e−/h+ pairs and thus increase its photocatalytis efficiency.

Figure 8A:
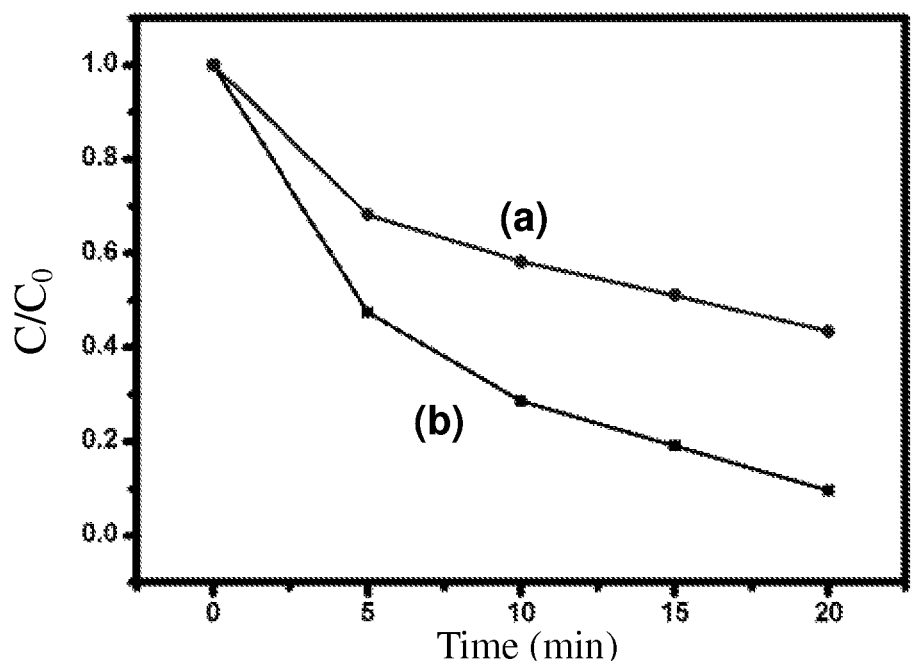
FIG. 8A to FIG. 8B are diagrams showing the degradation results of the unground photoelectric conversion material and the ground photoelectric conversion material according to a preferred embodiment of the present invention.
Figure 8B:
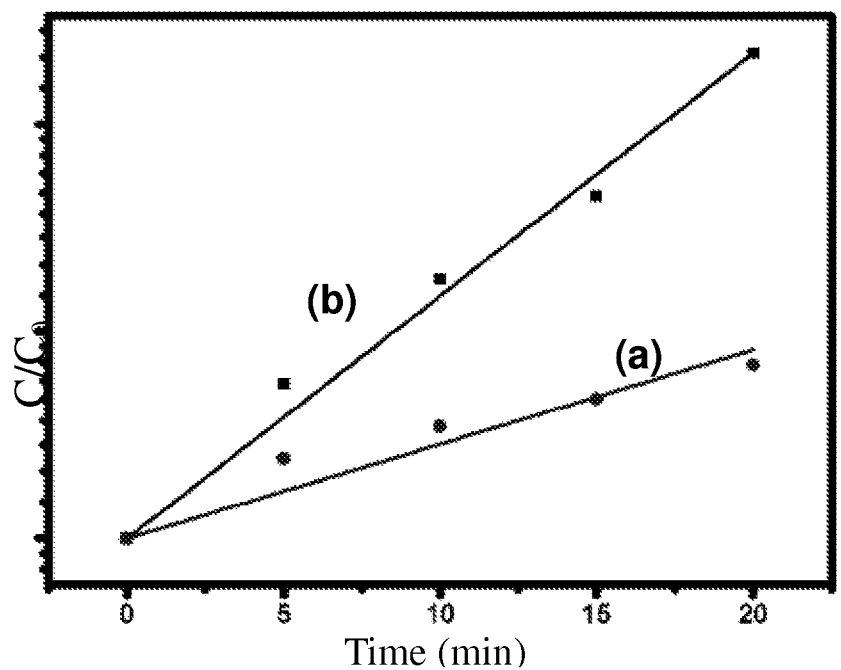

In the following illustration, the ground photoelectric conversion material and the unground photoelectric conversion material are used to degrade the methylene blue separately for proving the function of the abovementioned arrangement of the grains. Please refer to FIGS. 8A to 8B, FIG. 8A shows the relationship between the concentration of methylene blue and the radiation time, FIG. 8B is a plot of $\ln(C_0/C)$ versus radiation time. And then, a reaction rate constant can be obtained from the slope of FIG. 8B. As shown in FIG. 8B, the photocatalytic efficiency of the photoelectric conversion material drops substantially after grinding. Thus, the arrangement of the grains, such as from smaller ones to larger ones and from the exterior to the core, is contributive to promote the photocatalytic ability of the material.

Moreover, we will study the EPR of the ground and unground material. Please refer to FIG. 9, (a) and (b) are present the EPR at 10 K of unground and ground material, respectively. The electron trapped in the anatase-type phase shown a signal g=1.991. There is a broad signal around g=1.88-1.93 represented that electrons are trapped in different surface position. Due to the grains positioned at the core of the chrysanthemum are much larger than that positioned at the tip of the chrysanthemum, the most electronic signal should be contributed by the grains located at the core of the chrysanthemum. Alternatively, the surface electronic signal should be contributed by the grains located at the tip of the chrysanthemum, which are smaller but have bigger surface area.

Figure 9:
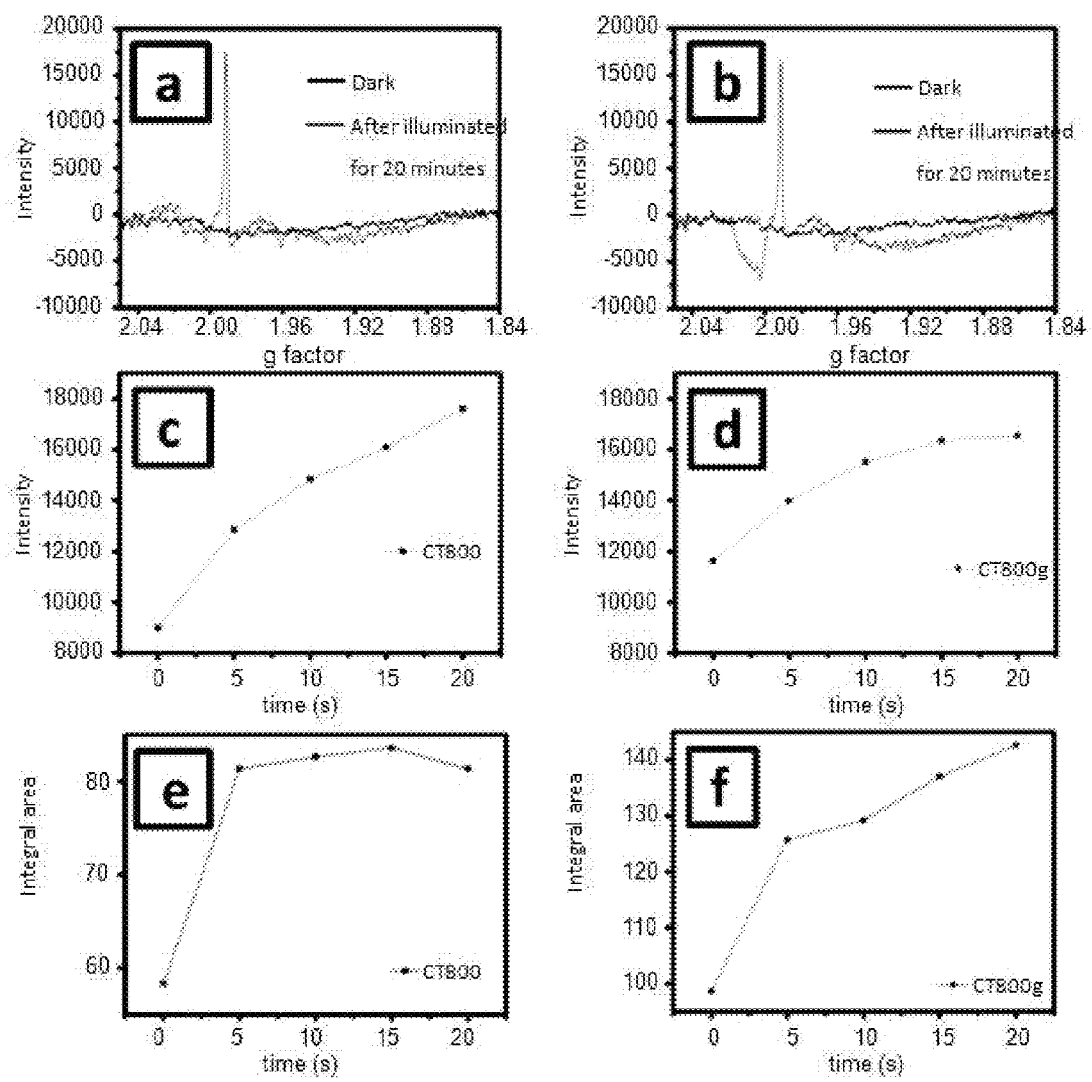
FIG. 9 are diagrams showing the EPR results of the unground (a) and the ground (b) photoelectric conversion material, the relationship between crystal electronic signal intensity and radiation time of the unground (c) and the ground (d) photoelectric conversion material, and the relationship between surface signal intensity and radiation time of the unground (e) and the ground (f) photoelectric conversion material.

According to the abovementioned, FIG. 9 (c), (d), (e) and (f) are the relationship between the intensities of specific signal and time. The intensities of surface electronic signal of unground material are decreased after 15 minutes as well as the intensities of crystal electronic signal are increasing. In contrast, the intensity of surface signal of unground material was increased and the intensity of crystal electronic signal is saturated at 15 mins. In summary, the surface electrons of unground material were tended to move into the crystal as the lighting time increase. It would cause the intensity of surface signal was slightly decrease. Moreover, the signal intensity of crystal electronic signal was not saturated at 15 minutes but kept increasing. It indicated the electron located at the petals of the chrysanthemum tend to move to the core of chrysanthemum.

On the contrary, the arrangement of the grains within the ground material has been broken so that the electrons do not trend to move into the crystal and the intensity of the signal increases with the radiation time. Moreover, the intensity of crystal electronic signal is saturated at 15 mins, that is, there are no electrons moved from the exterior of the material. Therefore, the good photocatalytic efficiency of the unground material can be attributed to the size arrangement of the grains. The size arrangement of the grains makes the energy state distribution of the whole chrysanthemum is decreased from the exterior to the core, therefore, the electrons will move toward the core of the chrysanthemum to decrease the recombination rate of $e^-/h^+$ pairs.

Figure 10:
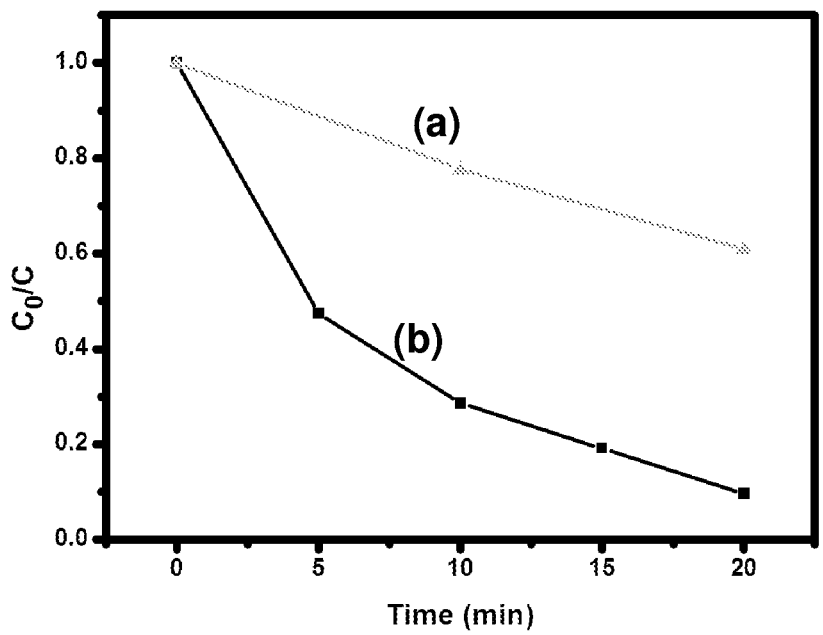
FIG. 10 is diagram showing the photocatalytic efficiency of the annealed precursor showed with a fibrillar appearance and the assembly of the cone materials according to a preferred embodiment of the present invention.

Please refer to FIG. 10, FIG. 10 is diagram showing the photocatalytic efficiency of FT and CT after annealing. As shown in the figure, the photocatalytic efficiency of the photoelectric conversion material composed of a plurality of fibrillar materials is obviously lower than that of the photoelectric conversion material composed of a plurality of cone materials.

To sum up, the present invention relates to a method of separating excited $e^-/h^+$ pairs. It is further illustrated that the present invention changes the energy state of the photoelectric conversion material by adjusting the sizes of the nanoscale grains. When the grains with different sizes are arranged from smaller ones to larger ones, the smaller ones will have higher energy state due to a quantum scale effect. Therefore, the excited electrons will move from the smaller grains to the larger grains, and the electron holes will move to another direction so that the recombination rate of the $e^-/h^+$ pairs is decreased. The photoelectric conversion material provided in the present invention can be applied in the photocatalytic reaction and further applied in the design of photo-voltaic devices.

Although the present invention has been described in terms of specific exemplary embodiments and examples, it will be appreciated that the embodiments disclosed herein are for illustrative purposes only and various modifications and alterations might be made by those skilled in the art without departing from the spirit and scope of the invention as set forth in the following claims.

We claim:

1. A photoelectric conversion material comprising at least a cone material and the cone material being composed of an isomer with a plurality of grains, wherein the sizes of the grains are arranged from smaller ones to larger ones along a direction and the assembly of a plurality of the cone materials has a chrysanthemum or spherical appearance.

2. The photoelectric conversion material according to claim 1, wherein the isomer is titanium oxide and the titanium oxide occurs as a mineral anatase.

3. The photoelectric conversion material according to claim 1, wherein the direction the grains arranged along is extended from the exterior to the core of the assembly.

* * * * *